United States Patent
Chen et al.

(10) Patent No.: US 11,049,572 B1
(45) Date of Patent: Jun. 29, 2021

(54) MEMORY DEVICE, SOURCE LINE VOLTAGE ADJUSTER AND SOURCE LINE VOLTAGE ADJUSTING METHOD THEREOF

(71) Applicant: MACRONIX International Co., Ltd., Hsinchu (TW)

(72) Inventors: Chung-Kuang Chen, Hsinchu (TW); Yi-Ting Lai, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/811,896

(22) Filed: Mar. 6, 2020

(51) Int. Cl.
  *G11C 16/26* (2006.01)
  *G11C 7/12* (2006.01)
  *G11C 16/24* (2006.01)

(52) U.S. Cl.
  CPC .......... *G11C 16/26* (2013.01); *G11C 7/12* (2013.01); *G11C 16/24* (2013.01)

(58) Field of Classification Search
  CPC ......... G11C 16/26; G11C 16/24; G11C 16/28; G11C 7/12
  See application file for complete search history.

(56) References Cited

U.S. PATENT DOCUMENTS

| 7,920,435 | B2 * | 4/2011 | Ogawa | G11C 16/24 365/205 |
| 9,368,224 | B2 | 6/2016 | Wang et al. | |
| 2014/0003154 | A1 * | 1/2014 | Abe | G11C 16/28 365/185.21 |

FOREIGN PATENT DOCUMENTS

TW   I615854   2/2018

OTHER PUBLICATIONS

"Office Action of Taiwan Counterpart Application", dated Sep. 25, 2020, p. 1-p. 8.

* cited by examiner

*Primary Examiner* — David Lam
(74) *Attorney, Agent, or Firm* — J.C. Patents

(57) ABSTRACT

A memory device, a source line voltage adjuster and a source line voltage adjusting method thereof are provided. The source line voltage adjuster includes an operation amplifier, a current drainer and a current generator. The operation amplifier includes a first input end coupled to a common source line and a second input end for receiving a reference voltage. The operation amplifier generates an bias voltage. The current drainer drains a drain current from the common source line according to the bias voltage. The current generator provides an output current for the common source line. The current generator generates a first current according to the bias voltage, and generates a second current according to a reference current. The current generator generates the output current according to a difference of the second current and the first current.

14 Claims, 5 Drawing Sheets

MEMORY DEVICE, SOURCE LINE VOLTAGE ADJUSTER AND SOURCE LINE VOLTAGE ADJUSTING METHOD THEREOF

BACKGROUND OF THE INVENTION

1. Field of the Invention

The present invention generally relates to a memory device, a source line voltage adjuster and a source line voltage adjusting method thereof, in particular, to a memory device capable of reducing power consumption, a source line voltage adjuster and a source line voltage adjusting method thereof.

2. Description of Related Art

In a conventional NAND flash memory, a common source line is shared based on a plurality of memory cell strings, and thus different currents are transmitted to the common source line for data stored in a selected memory cell in each memory cell string when a reading operation is executed on the memory cells.

On the other hand, in prior art, a current on the common source line is drained through a pull-down transistor, and a current source is provided to provide a current for the common source line. The pull-down transistor interacts with the current source to maintain a voltage value on the common source line. In the conventional art, the current generated by the current source is fixed, and certain power consumption is generated to cause unnecessary power waste.

SUMMARY OF THE INVENTION

The present invention provides a memory device, a source line voltage adjuster and a source line voltage adjusting method thereof, which effectively reduce power consumption.

The source line voltage adjuster of the present invention is used for being coupled to a common source line. The source line voltage adjuster includes an operation amplifier, a current drainer and a current generator. The operation amplifier includes a first input end coupled to the common source line and a second input end for receiving a reference voltage, and the operation amplifier generates a bias voltage. The current drainer is coupled between the common source line and a reference ground terminal, and drains a drain current from the common source line according to the bias voltage. The current generator is coupled to the common source line and the operation amplifier, and provides an output current for the common source line. The current generator generates a first current according to the bias voltage, and generates a second current according to a reference current. The current generator generates the output current according to a difference of the second current and the first current.

The memory device of the present invention includes the aforementioned source line voltage adjuster and a plurality of memory cell strings. The memory cell strings are coupled to a common source line.

A source line voltage adjusting method of the present invention is applied to a memory device. The source line voltage adjusting method includes that an operation amplifier is provided to generate an bias voltage according to a reference voltage and a voltage on a common source line; a current drainer is provided to drain a drain current from the common source line according to the bias voltage; and a current generator is provided to generate a first current according to the bias voltage, generate a second current according to a reference current, generate an output current according to a difference of the second current and the first current and provide the output current for the common source line.

Based on the above, in the source line voltage adjuster of the present invention, the output current is provided for the common source line through the current generator. The current generator adjusts the magnitude of the output current according to the bias voltage generated by the operation amplifier to provide an appropriate current value of the output current, and maintain the voltage on the common source line, so that unnecessary power consumption is effectively reduced.

In order to make the aforementioned and other objectives and advantages of the present invention comprehensible, embodiments accompanied with figures are described in detail below.

DESCRIPTION OF THE EMBODIMENTS

Figure 1:
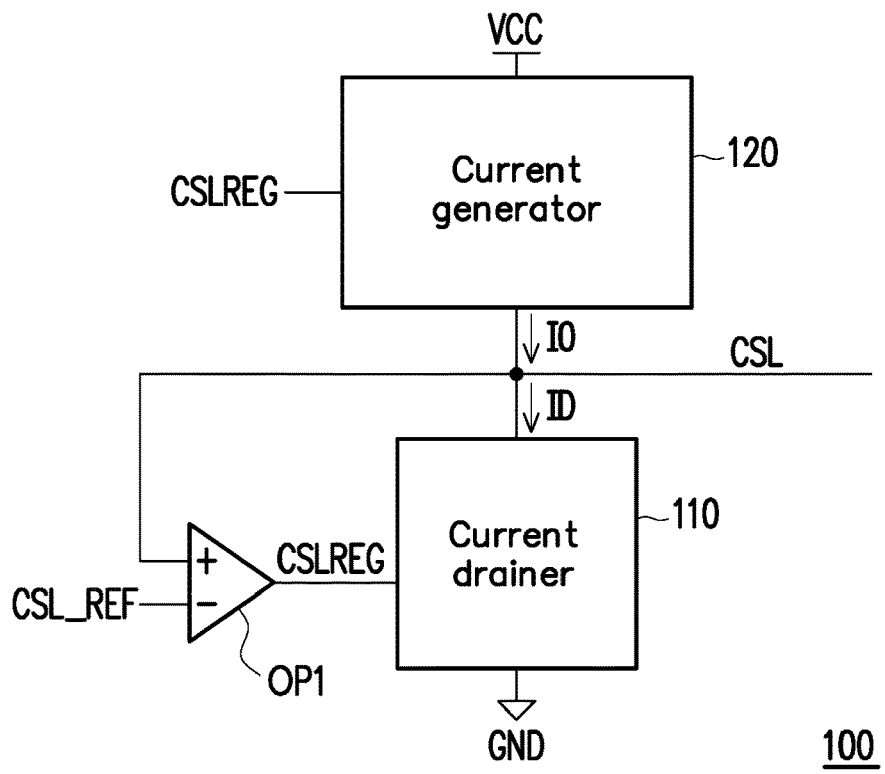
FIG. 1 is a schematic diagram of a source line voltage adjuster according to an embodiment of the present invention.

Referring to FIG. 1, FIG. 1 is a schematic diagram of a source line voltage adjuster according to an embodiment of the present invention. The source line voltage adjuster 100 is coupled to a common source line CSL. The source line voltage adjuster 100 includes an operation amplifier OP1, a current drainer 110 and a current generator 120. The operation amplifier OP1 includes a first input end (for example, a positive input end) coupled to the common source line CSL. The operation amplifier OP1 includes a second input end (for example, a negative input end) for receiving a reference voltage CSL_REF. An output end of the operation amplifier OP1 generates an bias voltage CSLREG.

In addition, in the present embodiment, the current drainer 110 is coupled between the common source line CSL and a reference ground terminal GND. The current drainer 110 is also coupled to the output end of the operation amplifier OP1, and receives the bias voltage CSLREG generated by the operation amplifier OP1. The current drainer 110 is used for draining a drain current ID from the common source line according to the bias voltage CSLREG. In the present embodiment, the magnitude of the drain current ID generated by the current drainer 110 is positively correlated with the bias voltage CSLREG. Specifically, when the bias voltage CSLREG is in a specific range, the drain current ID generated by the current drainer 110 is directly proportional to the bias voltage CSLREG. The current generator 120 is coupled between a power voltage VCC and the common source line CSL. In the present embodiment, the current generator 120 is used for providing an output current IO for the common source line CSL. When the output current IO is higher than the drain current ID, a voltage on the common source line CSL is pulled up; when the output current IO is lower than the drain current ID, the voltage on the common source line CSL is pulled down; and when the output current IO is equal to the drain current ID, the voltage on the common source line CSL is kept unchanged.

It should be noted that, in the present embodiment, the current generator 120 generates the output current IO according to the magnitude of the bias voltage CSLREG. Specifically, the output current IO generated by the current generator 120 is negatively correlated with the bias voltage CSLREG. That is, when the bias voltage CSLREG rises, the output current IO generated by the current generator 120 is adjusted downward; and on the contrary, when the bias voltage CSLREG drops, the output current IO generated by the current generator 120 is adjusted upward.

In terms of overall operation, when the common source line CSL receives a relatively high current (for example, source currents from a plurality of memory strings of a memory device), there exists the phenomenon that the voltage on the common source line CSL is pulled up in a short period. Based on pulling-up of the voltage on the common source line CSL, the operation amplifier OP1 increases a voltage value of the generated bias voltage CSLREG and increases the drain current ID generated by the current drainer 110. Correspondingly, the current generator 120 adjusts downward a current value of the generated output current IO according to the voltage value of the pulled-up bias voltage CSLREG. Therefore, the voltage on the common source line CSL is inhibited from being pulled up and kept at a preset voltage value.

On the contrary, when the common source line CSL receives a relatively low current (for example, the source current from a plurality of memory strings of the memory device), there exists the phenomenon that the voltage on the common source line CSL is pulled down in a short period. Based on pulling-down of the voltage on the common source line CSL, the operation amplifier OP1 decreases the voltage value of the generated bias voltage CSLREG and decreases the drain current ID generated by the current drainer 110. Correspondingly, the current generator 120 adjusts upward the current value of the generated output current IO according to the voltage value of the pulled-down bias voltage CSLREG. Therefore, the voltage on the common source line CSL is inhibited from being pulled down and kept at the preset voltage value.

From the above descriptions, it can be seen that the output current IO in the present invention is not a fixed current value but is adjusted according to a change in the bias voltage CSLREG. Therefore, according to the source line voltage adjuster 100 of the embodiment of the present invention, power consumption is reduced, and unnecessary power waste is reduced.

Figure 2:
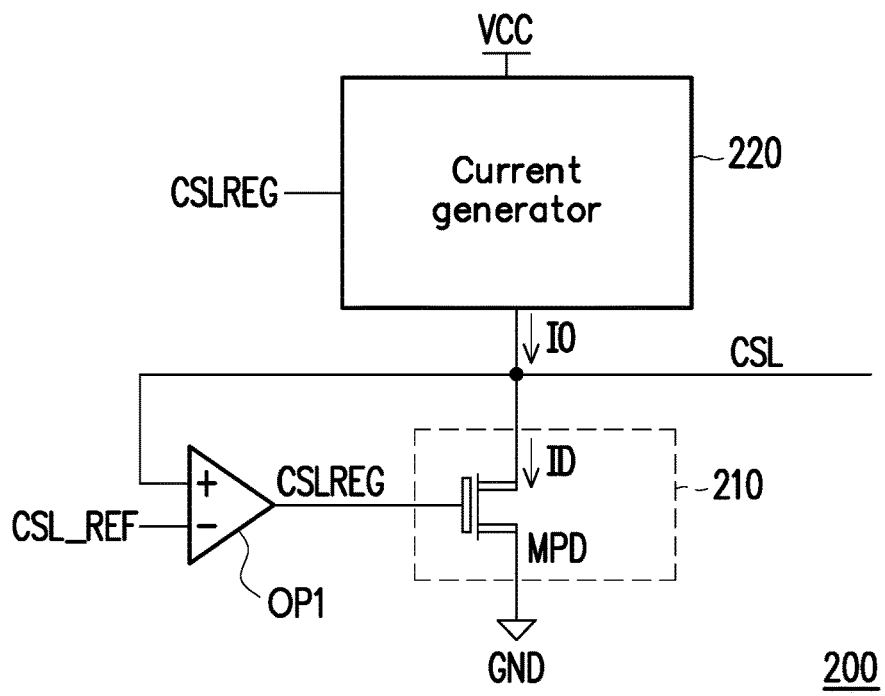
FIG. 2 is a schematic diagram of a source line voltage adjuster according to another embodiment of the present invention.

Referring to FIG. 2, FIG. 2 is a schematic diagram of a source line voltage adjuster according to another embodiment of the present invention. The source line voltage adjuster 200 includes the operation amplifier OP1, a current drainer 210 and a current generator 220. The operation amplifier OP1 includes a first input end (for example, a positive input end) coupled to the common source line CSL. The operation amplifier OP1 includes a second input end (for example, a negative input end) for receiving the reference voltage CSL_REF. An output end of the operation amplifier OP1 generates the bias voltage CSLREG.

In the present embodiment, the current drainer 210 is formed by a transistor MPD. A first end of the transistor MPD is coupled to the common source line CSL, a second end of the transistor MPD is coupled to the reference ground terminal GND, and a control end of the transistor MPD is coupled to the output end of the operation amplifier OP1 to receive the bias voltage CSLREG.

The transistor MPD is a pull-down transistor, and generates the drain current ID according to the bias voltage CSLREG. In the present embodiment, a polarity of the transistor MPD is an N type, and a current value of the generated drain current ID is positively correlated with the bias voltage CSLREG.

Figure 3:
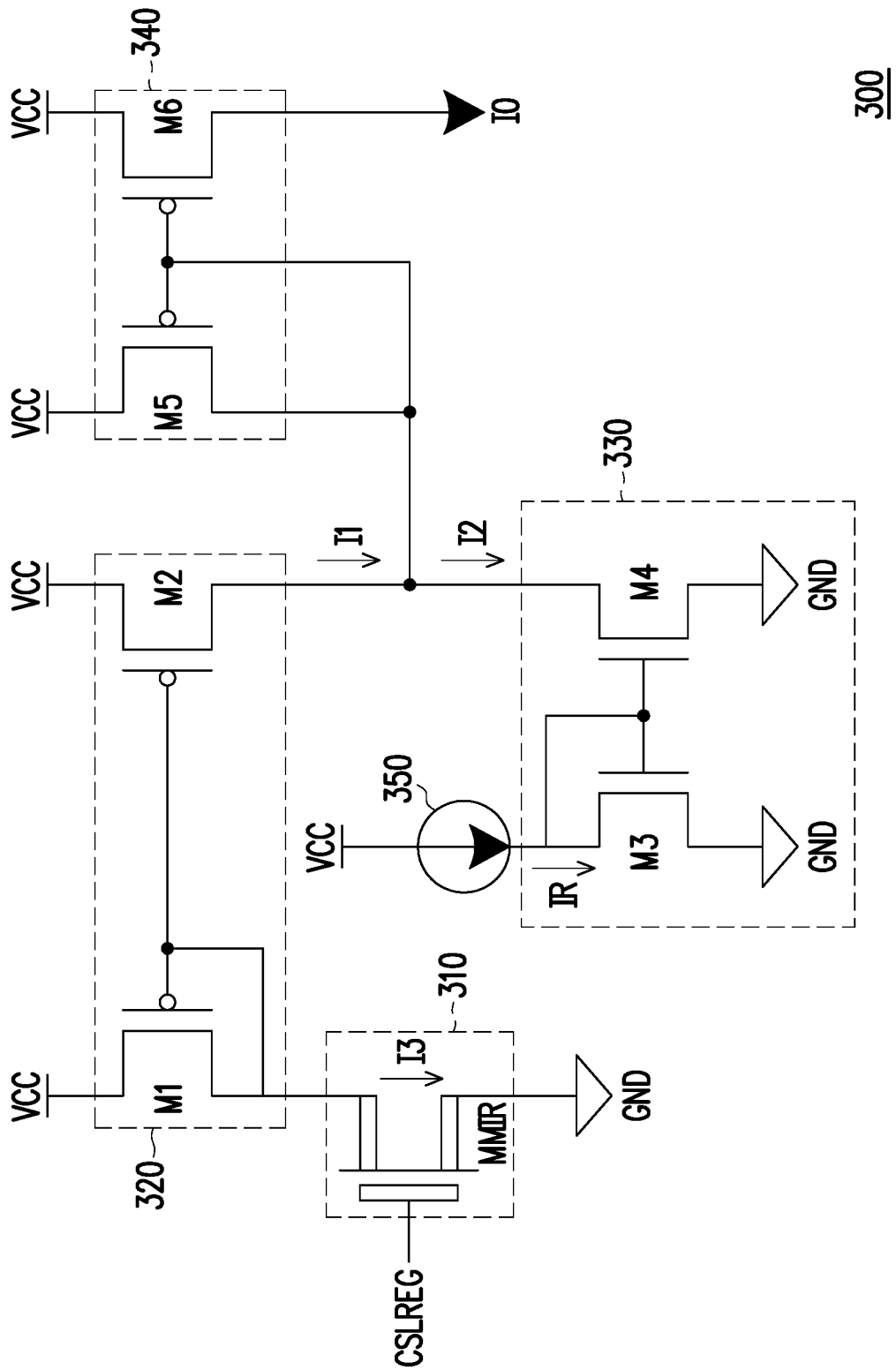
FIG. 3 is a schematic diagram of an implementation mode of a current generator of a source line voltage adjuster according to an embodiment of the present invention.

Referring to FIG. 3 below, FIG. 3 is a schematic diagram of an implementation mode of a current generator of a source line voltage adjuster according to an embodiment of the present invention. The current generator 300 includes a current source 310, current mirrors 320, 330 and 340 and a reference current source 350. The current source 310 is formed by a transistor MMIR. A first end of the transistor MMIR is coupled to the current mirror 320, a second end of the transistor MMIR is coupled to the reference ground terminal GND, and a control end of the transistor MMIR receives the bias voltage CSLREG and generates a current I3 according to the bias voltage CSLREG. The current generator 120 in FIG. 1 and the current generator 220 in FIG. 2 can be implemented by the current generator 300 of presented embodiment.

In addition, the current mirror 320 receives the current I3, and mirrors the current I3 to generate a current I1. The current mirror 320 includes transistors M1 and M2. First ends of both the transistors M1 and M2 receive a power voltage VCC. A second end of the transistor M1 is coupled to a control end thereof, and is also coupled to a control end of the transistor M2. The second end of the transistor M1 also receives the current I3, and a second end of the transistor M2 generates the current I1.

On the other hand, the current mirror 330 is coupled to the reference current source 350, and the current mirror 330 receives a reference current IR generated by the reference current source 350, and mirrors the reference current IR to generate a current I2. The current mirror 330 includes transistors M3 and M4. Second ends of both the transistors M3 and M4 are coupled to the reference ground terminal GND. A first end of the transistor M3 receives the reference current IR, and is coupled to a control end of the transistor M3 and a control end of the transistor M4. In addition, a first end of the transistor M4 is coupled to the second end of the transistor M2, and the first end of the transistor M4 drains the current I2.

It should be noted here that an effect of subtracting the current I2 from the current I1 is achieved at a coupling end point of the second end of the transistor M2 and the first end of the transistor M4. In the present embodiment, an absolute value of the current I2 is greater than an absolute value of the current I1, and a difference of the current I2 and the current I1 is provided for the current mirror 340.

The current mirror 340 is coupled to the current mirrors 320 and 330. The current mirror 340 is used for mirroring the difference of the current I2 and the current I1 to generate the output current IO. The current mirror 340 includes transistors M5 and M6. First ends of both the transistors M5 and M6 receive the power voltage VCC. A second end of the transistor M5 receives the difference of the current I2 and the current I1, and is coupled to a control end of the transistor M5 and a control end of the transistor M6. A second end of the transistor M6 generates the output current IO.

It should be noted that, in the present embodiment, the transistor MMIR has a polarity the same as that of the transistor MPD (i.e. transistors MMIR and MPD both are N-type transistors) for forming the current drainer 210 in the embodiment shown in FIG. 2. In another embodiment, the transistors MMIR and MPD may have same electrical characteristic. For example, the transistors MMIR and MPD may have same width to length ratio of channels. Such as that, the current generator 300 is matched relatively well with the current drainer 210 in property. In addition, the transistors M1, M2, M5 and M6 in the present embodiment have the same polarity, the transistors M3 and M4 have the same polarity, and the transistors M1 and M3 have different polarities. Further, the transistors M1, M2, M5 and M6 are P-type transistors, and the transistors M3 and M4 are N-type transistors.

In addition, current mirroring rates provided by the current mirrors 320, 330 and 340 are not required to be 1:1, and a designer makes different or the same design for the current mirroring rates of the current mirrors 320, 330 and 340 according to a practical requirement without limitation respectively.

Figure 4:
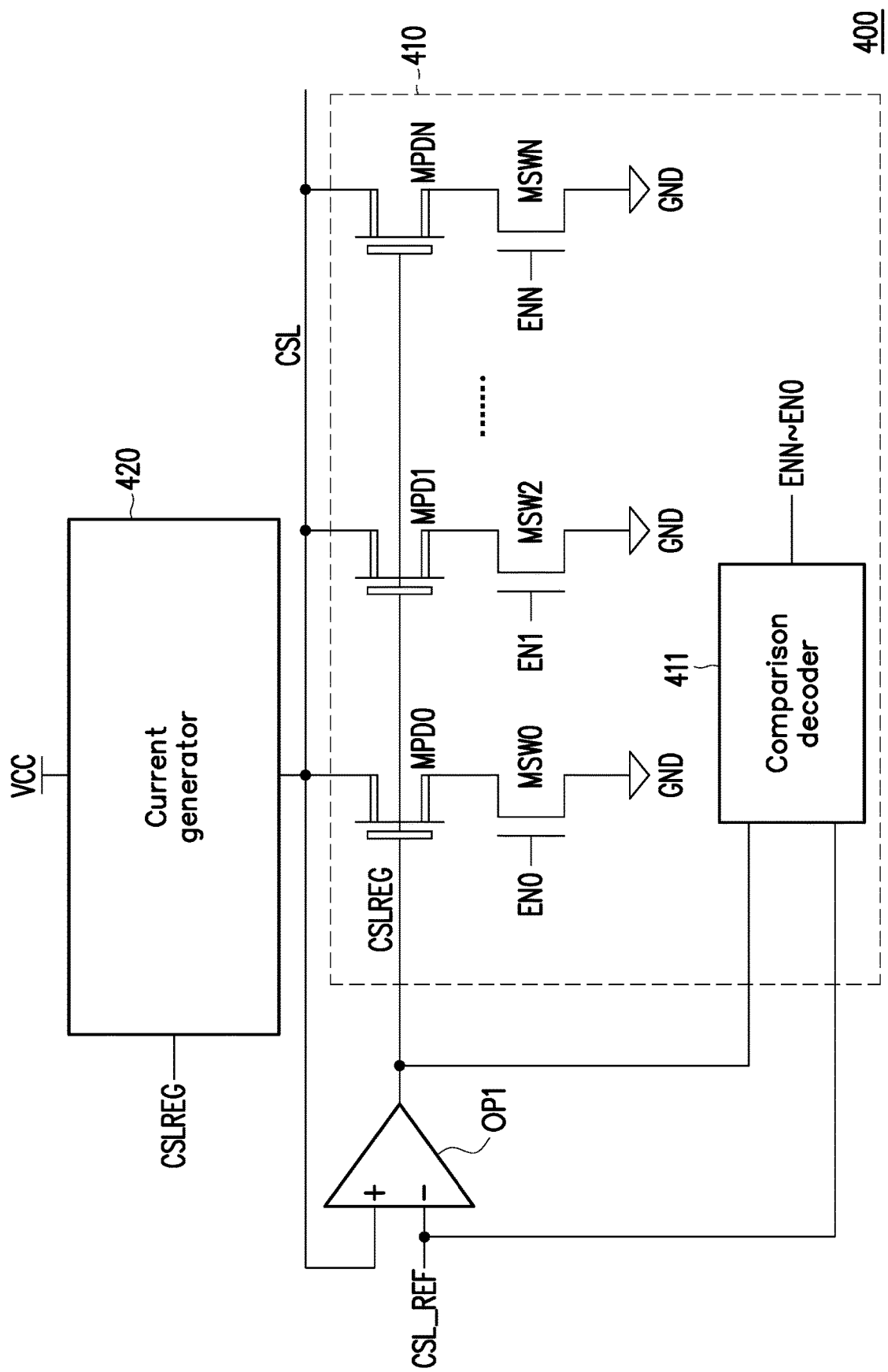
FIG. 4 is a schematic diagram of a source line voltage adjuster according to another embodiment of the present invention.

Referring to FIG. 4 below, FIG. 4 is a schematic diagram of a source line voltage adjuster according to another embodiment of the present invention. The source line voltage adjuster 400 includes the operation amplifier OP1, a current drainer 410 and a current generator 420. The source line voltage adjuster 400 includes the operation amplifier OP1, the current drainer 410 and the current generator 420. The operation amplifier OP1 includes a first input end (for example, a positive input end) coupled to the common source line CSL. The operation amplifier OP1 includes a second input end (for example, a negative input end) for receiving the reference voltage CSL_REF. An output end of the operation amplifier OP1 generates the bias voltage CSLREG.

In the present embodiment, the current drainer 410 includes transistors MPD0-MPDN, transistors MSW1-MSWN and a comparison decoder 411. The transistors MPD0-MPDN are used as a plurality of current sources generating and draining currents, and the transistors MSW1-MSWN are used as a plurality of switches respectively. First ends of all the transistors MPD0-MPDN are coupled to the common source line CSL, and the transistors MSW1-MSWN are connected in series with the transistors MPD0-MPDN between the common source line CSL and the reference ground terminal. Control ends of all the transistors MPD0-MPDN receive the bias voltage CSLREG generated by the operation amplifier OP1, and control ends of the transistors MSW1-MSWN receive a plurality of enable signals EN0-ENN respectively.

On the other hand, the comparison decoder 411 is coupled to the operation amplifier OP1. The comparison decoder 411 compares the reference voltage CSL_REF and the bias voltage CSLREG to generate a comparison result, and decodes the comparison result to generate the enable signals ENN-EN0.

In terms of operation, the comparison decoder 411 compares the reference voltage CSL_REF and the bias voltage CSLREG, and decodes the magnitude of a difference value of the reference voltage CSL_REF and the bias voltage CSLREG to generate the enable signals ENN-EN0. Through the enable signals ENN-EN0, the number of the transistors MSW0-MSWN that are turned on is controlled, and the transistors MPD0-MPDN corresponding to the transistors MSW0-MSWN that are turned on respectively provide drain currents to pull down a voltage level on the common source line CSL.

In the embodiment of the present invention, the comparison decoder 411 is provided with a voltage division circuit for performing voltage division for the reference voltage CSL_REF and generating a plurality of sub reference voltages. The comparison decoder 411 is also provided with a plurality of comparator circuits for comparing the bias voltage CSLREG and a plurality of sub reference voltages to generate a comparison result. The comparison decoder 411 is provided with a digital circuit for executing a decoding operation for the comparison result to generate the enable signals ENN-EN0.

In other embodiments of the present invention, the comparison decoder 411 also executes an analogue voltage subtraction operation for the bias voltage CSLREG and the reference voltage CSL_REF to generate a comparison result. Then, the comparison decoder 411 decodes the comparison result in an analogue-to-digital conversion manner to generate the enable signals ENN-EN0.

Herein, the drain current generated by the current drainer 410 is adjusted in a plurality of stages in the embodiment of the present invention. Therefore, every pull-down transistor (every one of transistors MPD~MPDN) which is turned on in current drainer 410 can operate in saturation region and a stability of regulation of the common source line CSL can be improved.

Figure 5:
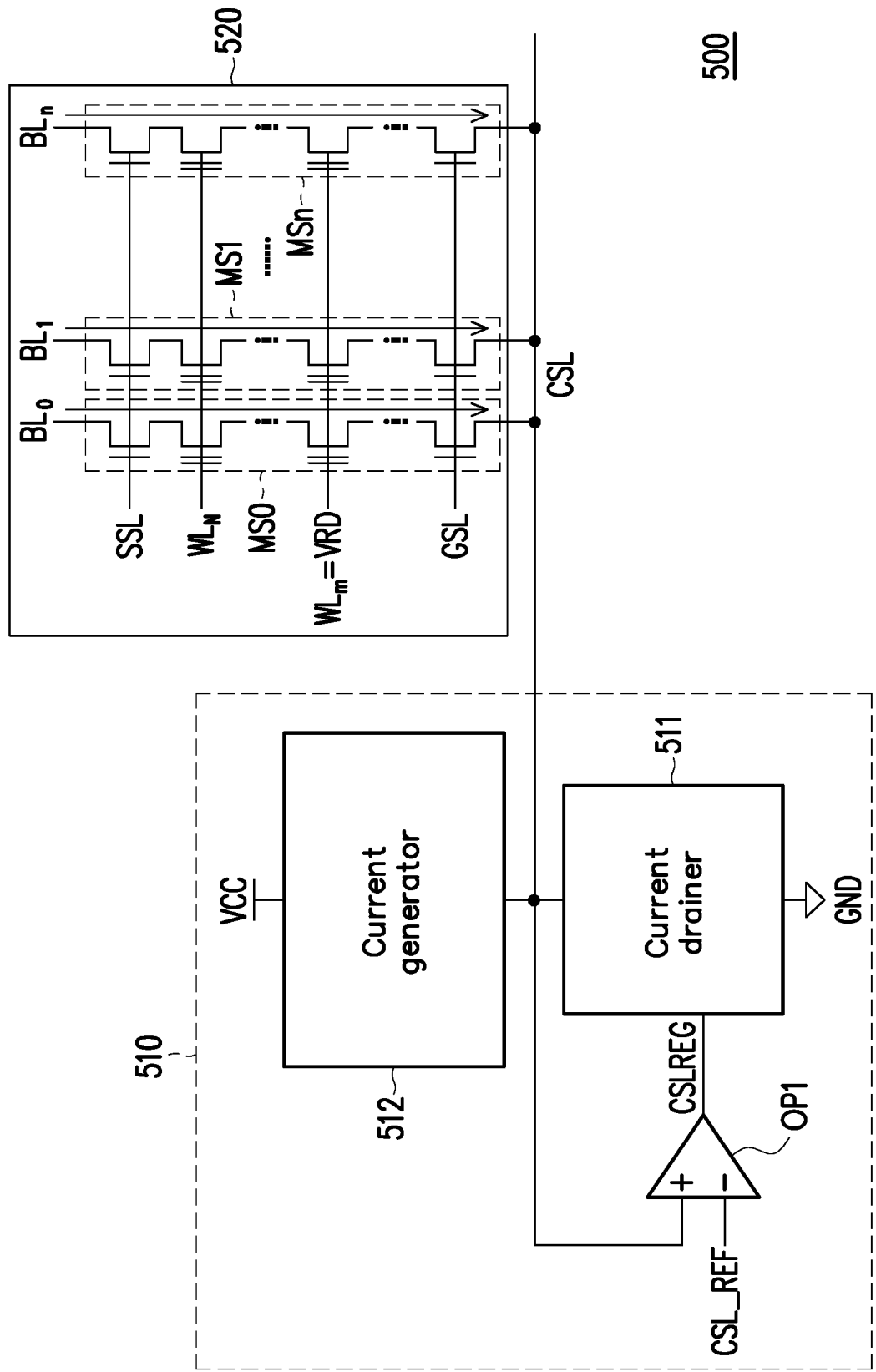
FIG. 5 is a schematic diagram of a memory device according to an embodiment of the present invention.

Referring to FIG. 5, FIG. 5 is a schematic diagram of a memory device according to an embodiment of the present invention. The memory device 500 includes a source line voltage adjuster 510 and a memory cell array 520 formed by a plurality of memory cell strings MS0-MSN. The a plurality of memory cell strings MS0-MSN are coupled to bit lines $BL_0$-$BL_n$ respectively, are all coupled to the common source line CSL, and receive a source line selection signal SSL, a ground selection signal GSL and a plurality of word line signals $WL_N$-$WL_M$. The source line voltage adjuster 510 is coupled to the common source line CSL. The source line voltage adjuster 510 includes a current drainer 511, a current generator 512 and the operation amplifier OP1. Implementation details about the source line voltage adjuster 510 are described in a plurality of aforementioned embodiments and the descriptions thereof are omitted herein.

When the memory cell strings MS0-MSN execute a reading operation, the memory cell strings MS0-MSN provide a plurality of source currents for the common source line CSL according to the word line signal $WL_M$ set as a reading voltage VRD and data stored in memory cells. The source line voltage adjuster 510 dynamically adjusts current value of a drain current and an output current generated by the current drainer 511 and the current generator 512 respectively for a voltage changing state of the common source line CSL to reduce unnecessary power consumption.

Figure 6:
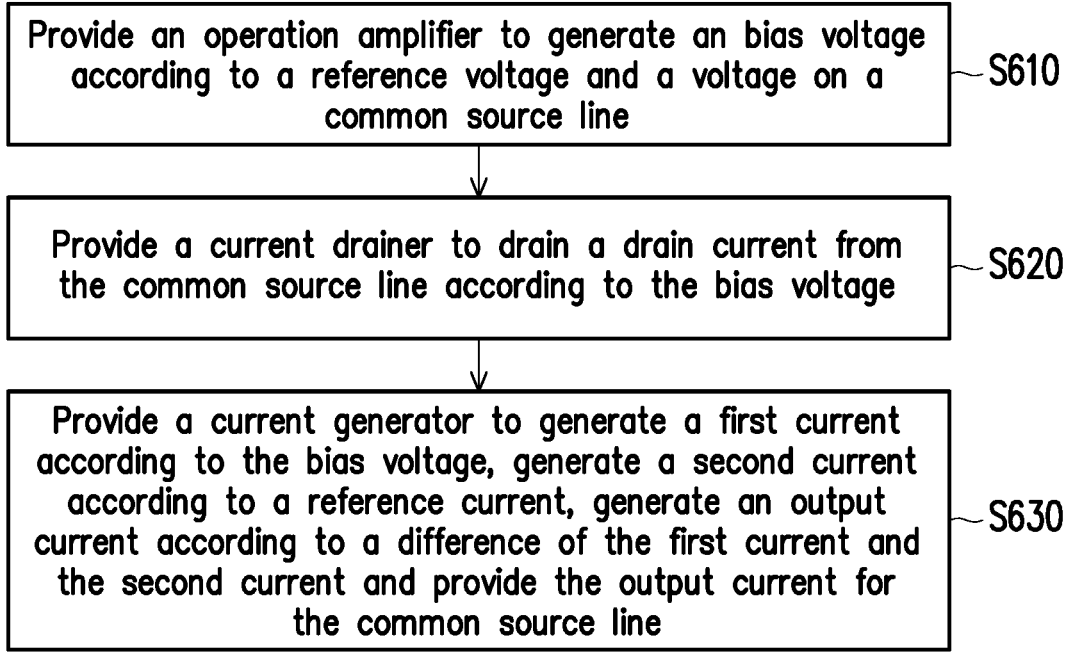
FIG. 6 is a flowchart of a source line voltage adjusting method according to an embodiment of the present invention.

Referring to FIG. 6 below, FIG. 6 is a flowchart of a source line voltage adjusting method according to an embodiment of the present invention. In step S610, an operation amplifier is provided to generate an bias voltage according to a reference voltage and a voltage on a common source line. In step S620, a current drainer is provided to drain a drain current from the common source line according to the bias voltage. Moreover, in step S630, a current generator is provided to generate a first current I1 according to the bias voltage, generate a second current I2 according to the reference current, generate the output current according to a difference of the second current and the first current and provide the output current for the common source line.

Implementation details about each step in the present embodiment are described in the aforementioned embodiments and the descriptions thereof are omitted herein.

Based on the above, according to the present invention, the voltage on the common source line is compared with the preset reference voltage to generate the bias voltage, and the current generator adjusts the magnitude of the output current provided for the common source line according to the bias voltage. Therefore, provision of a constant output current for the common source line is avoided to effectively reduce unnecessary power consumption and achieve the purpose of saving energy.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A source line voltage adjuster, coupled to a common source line and comprising:
    an operation amplifier, comprising a first input end coupled to the common source line and a second input end for receiving a reference voltage, the operation amplifier generating a bias voltage;
    a current drainer, coupled between the common source line and a reference ground terminal and draining a drain current from the common source line according to the bias voltage; and
    a current generator, coupled to the common source line and providing an output current for the common source line, the current generator generating a first current according to the bias voltage and generating a second current according to a reference current, and the current generator generating the output current according to a difference of the second current and the first current,
    wherein the current generator comprises:
        a first current source, generating a third current according to the bias voltage;
        a first current mirror, coupled to the first current source and mirroring the third current to generate the first current;
        a second current mirror, mirroring the reference current to generate the second current; and
        a third current mirror, mirroring the difference of the first current and the second current to generate the output current.

2. The source line voltage adjuster according to claim 1, wherein the current drainer is a first transistor, a control end of the first transistor receives the bias voltage, a first end of the first transistor is coupled to the common source line, and a second end of the first transistor is coupled to the reference ground terminal.

3. The source line voltage adjuster according to claim 2, wherein the first current source is a second transistor, a first end of the second transistor is coupled to the first current mirror and provides the third current, a second end of the second transistor is coupled to the reference ground terminal, and a control end of the second transistor receives the bias voltage.

4. The source line voltage adjuster according to claim 3, wherein the first transistor and the second transistor have the same electrical characteristics.

5. The source line voltage adjuster according to claim 1, wherein the current generator further comprises:
    a reference current source, coupled to the second current mirror and used for providing the reference current.

6. The source line voltage adjuster according to claim 1, wherein the first current mirror comprises:
    a first transistor, having a first end for receiving a power voltage, a second end of the first transistor receiving the third current and a control end of the first transistor being coupled to the second end of the first transistor; and
    a second transistor, having a first end for receiving the power voltage, a control end of the second transistor being coupled to the control end of the first transistor and a second end of the second transistor generating the first current.

7. The source line voltage adjuster according to claim 6, wherein the second current mirror comprises:
    a third transistor, having a first end for receiving the reference current, the first end of the third transistor being coupled to a control end of the third transistor and a second end of the third transistor being coupled to the reference ground terminal; and
    a fourth transistor, having a first end coupled to the second end of the second transistor, a second end of the fourth transistor being coupled to the reference ground terminal and a control end of the fourth transistor being coupled to the control end of the third transistor.

8. The source line voltage adjuster according to claim 7, wherein the third current mirror comprises:
    a fifth transistor, having a first end for receiving the power voltage, a second end of the fifth transistor being coupled to the second end of the second transistor and the first end of the fourth transistor and a control end of the fifth transistor being coupled to the second end of the fifth transistor; and
    a sixth transistor, having a first end for receiving the power voltage, a second end of the sixth transistor generating the output current and a control end of the sixth transistor being coupled to the control end of the fifth transistor,
    wherein a current at the second end of the fifth transistor is equal to the difference of the second current and the first current.

9. The source line voltage adjuster according to claim 8, wherein polarities of the first transistor, the second transistor, the fifth transistor and the sixth transistor are the same, polarities of the third transistor and the fourth transistor are the same, and the polarities of the first transistor and the third transistor are different.

10. The source line voltage adjuster according to claim 1, wherein the current drainer comprises:
    a plurality of transistors, connected in parallel with one another and coupled between the common source line and the reference ground terminal, control ends of all the transistors receiving the bias voltage and being used for draining the drain current from the common source line;
    a plurality of switches, connected in series in coupling paths of the transistors and the common source line respectively and controlled by a plurality of enable signals respectively; and
    a comparison decoder, comparing the reference voltage and the bias voltage to generate a comparison result and decoding the comparison result to generate the enable signals.

11. A memory device, comprising:
   the source line voltage adjuster according to claim 1; and
   a plurality of memory cell strings, coupled to a common source line.

12. The memory device according to claim 11, wherein the memory cell strings are coupled to a plurality of bit lines respectively, and all receive a source line selection signal, a ground selection signal and a plurality of word line signals.

13. The memory device according to claim 11, wherein, during a reading operation, the memory cell strings provide a plurality of source currents for the common source line according to data in a plurality of selected memory cells.

14. A source line voltage adjusting method, applied to a memory device and comprising:
   providing an operation amplifier to generate a bias voltage according to a reference voltage and a voltage on a common source line;
   providing a current drainer to drain a drain current from the common source line according to the bias voltage; and
   providing a current generator to generate a third current according to the bias voltage and mirror the third current to generate a first current; mirror the reference current to generate a second current, mirror a difference of the second current and the first current to generate an output current and provide the output current for the common source line.

* * * * *